(12) United States Patent
Eichenberg et al.

(10) Patent No.: US 10,299,341 B2
(45) Date of Patent: *May 21, 2019

(54) LIGHTING DEVICE, LIGHTING ARRANGEMENT COMPRISING LIGHTING DEVICE AND METHOD FOR OPERATING A LIGHTING DEVICE

(71) Applicant: OSRAM Opto Semiconductors GmbH, Regensburg (DE)

(72) Inventors: Boris Eichenberg, Schierling (DE); Juergen Holz, Wenzenbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/882,842

(22) Filed: Jan. 29, 2018

(65) Prior Publication Data

US 2018/0168010 A1 Jun. 14, 2018

Related U.S. Application Data

(63) Continuation of application No. 15/387,553, filed on Dec. 21, 2016, now Pat. No. 9,918,368, which is a (Continued)

(30) Foreign Application Priority Data

Jun. 27, 2012 (DE) .................. 10 2012 105 630

(51) Int. Cl.
*B60Q 1/02* (2006.01)
*H05B 33/08* (2006.01)
(Continued)

(52) U.S. Cl.
CPC ......... *H05B 33/089* (2013.01); *B60Q 1/1415* (2013.01); *H01L 25/0753* (2013.01);
(Continued)

(58) Field of Classification Search
None
See application file for complete search history.

(56) References Cited

U.S. PATENT DOCUMENTS 4,021,607 A 5/1977 Amano
4,845,405 A 7/1989 Yamane et al.
(Continued)

FOREIGN PATENT DOCUMENTS

CN 101124430 A 2/2008
CN 101261399 A 9/2008
(Continued)

OTHER PUBLICATIONS

Notice of Reasons for Rejection dated Nov. 27, 2018 in Japanese Application No. 2018-010370 with English Translation.
(Continued)

*Primary Examiner* — Anh Q Tran
(74) *Attorney, Agent, or Firm* — McDermott Will & Emery LLP

(57) ABSTRACT

A lighting device comprising a plurality of components (2) provided for generating radiation, a plurality of row lines (Z1, Z2) and a plurality of column lines (S1, S2, ..., S5) is specified, wherein the components are in each case electrically conductively connected to a row line and to a column line and the lighting device is provided for the simultaneous operation of at least two components. A lighting arrangement comprising such a lighting device and a method for operating a lighting device are furthermore specified.

16 Claims, 5 Drawing Sheets

Related U.S. Application Data continuation of application No. 14/410,565, filed as application No. PCT/EP2013/061907 on Jun. 10, 2013, now Pat. No. 9,554,439.

(51) Int. Cl.
  *H01L 25/075* (2006.01)
  *B60Q 1/14* (2006.01)
  *H01L 25/16* (2006.01)

(52) U.S. Cl.
  CPC ..... *H05B 33/0827* (2013.01); *H05B 33/0845* (2013.01); *H01L 25/167* (2013.01); *H01L 2224/48091* (2013.01); *H01L 2924/1301* (2013.01)

(56) References Cited

U.S. PATENT DOCUMENTS

| | | | |
|---|---|---|---|
| 6,774,878 | B2 | 8/2004 | Yoshida et al. |
| 7,498,933 | B2 * | 3/2009 | Pederson ............ B60Q 1/2611 340/321 |
| 7,999,454 | B2 | 8/2011 | Winters et al. |
| 9,554,439 | B2 | 1/2017 | Eichenberg et al. |
| 9,918,368 | B2 * | 3/2018 | Eichenberg .......... H05B 33/089 |
| 2005/0127376 | A1 | 6/2005 | Young et al. |
| 2006/0157718 | A1 | 7/2006 | Seo et al. |
| 2006/0244623 | A1 | 11/2006 | Pederson |
| 2007/0210317 | A1 | 9/2007 | Chou et al. |
| 2008/0036398 | A1 | 2/2008 | Zommer et al. |
| 2008/0150440 | A1 * | 6/2008 | Hsu ................. H05B 33/0803 315/191 |
| 2010/0259164 | A1 | 10/2010 | Oohata et al. |
| 2011/0248642 | A1 | 10/2011 | Kikuchi et al. |
| 2012/0056562 | A1 | 3/2012 | Higuchi |

FOREIGN PATENT DOCUMENTS

| | | |
|---|---|---|
| CN | 101283218 A | 10/2008 |
| CN | 101740707 A | 6/2010 |
| CN | 101859714 A | 10/2010 |
| DE | 2731717 A1 | 2/1978 |
| DE | 3931262 A1 | 3/1991 |
| DE | 60019689 T2 | 2/2006 |
| DE | 102005049685 A1 | 4/2007 |
| EP | 0923788 A1 | 6/1999 |
| EP | 1967897 A1 | 9/2008 |
| GB | 1585394 A | 3/1981 |
| JP | H0629575 A | 2/1994 |
| JP | 2001155857 A | 6/2001 |
| JP | 2004356000 A | 12/2004 |
| JP | 3140830 U | 4/2008 |
| JP | 2008537344 A | 9/2008 |
| JP | 2009054913 A | 3/2009 |
| JP | 2010153359 A | 7/2010 |
| JP | 2011124333 A | 6/2011 |
| JP | 2011221262 A | 11/2011 |
| JP | 2012059525 A | 3/2012 |
| WO | WO-2006/063552 A1 | 6/2006 |
| WO | WO-2008096588 A1 | 8/2008 |

OTHER PUBLICATIONS

KIPO's Notice of Preliminary Rejection dated March 9, 2019 in Korean Patent Application No. 10-2014-7036165.

\* cited by examiner

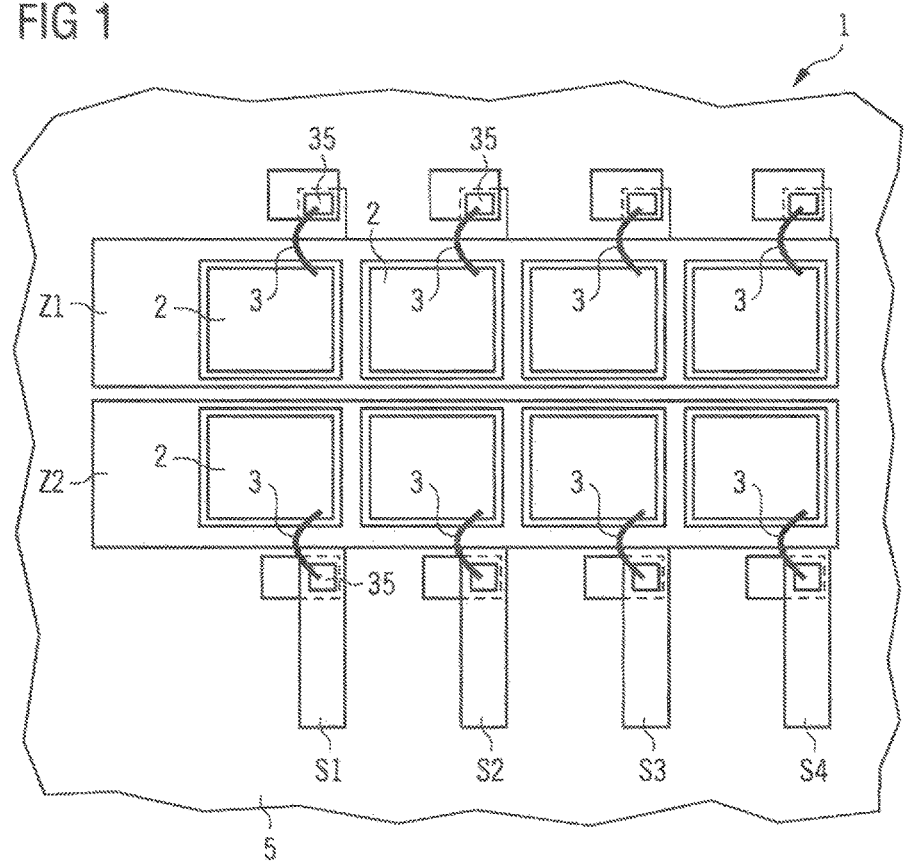

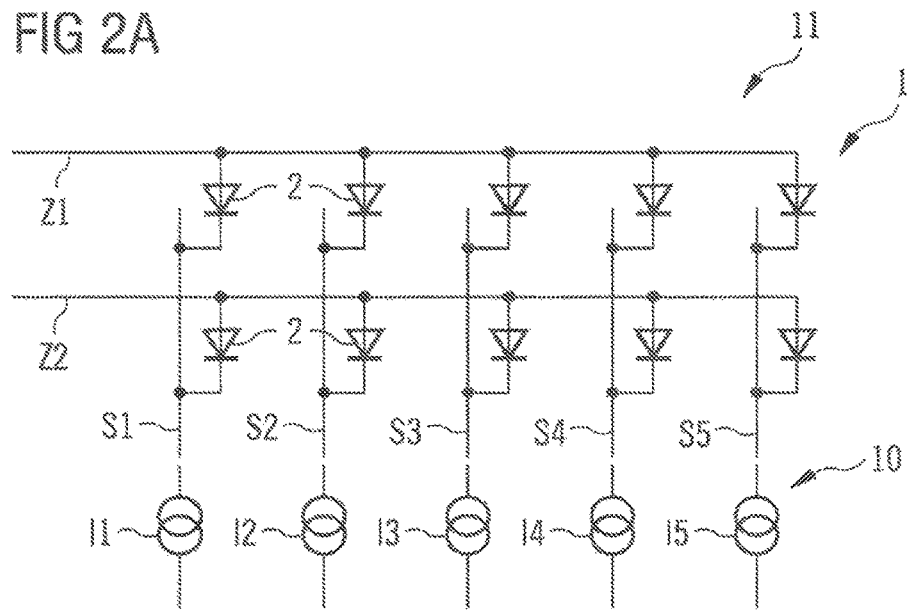

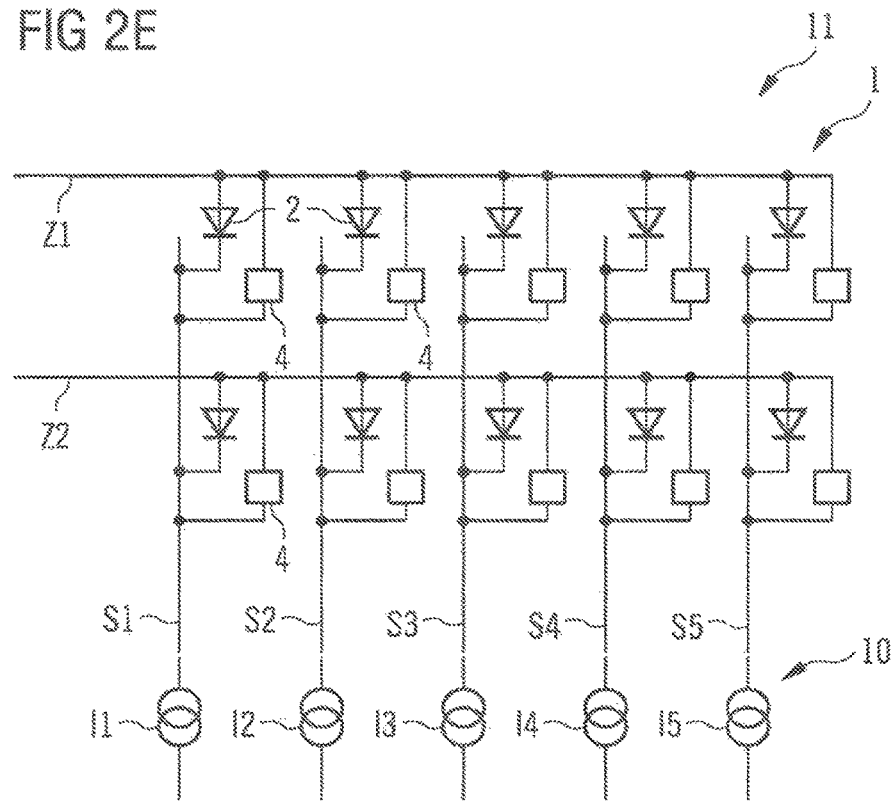

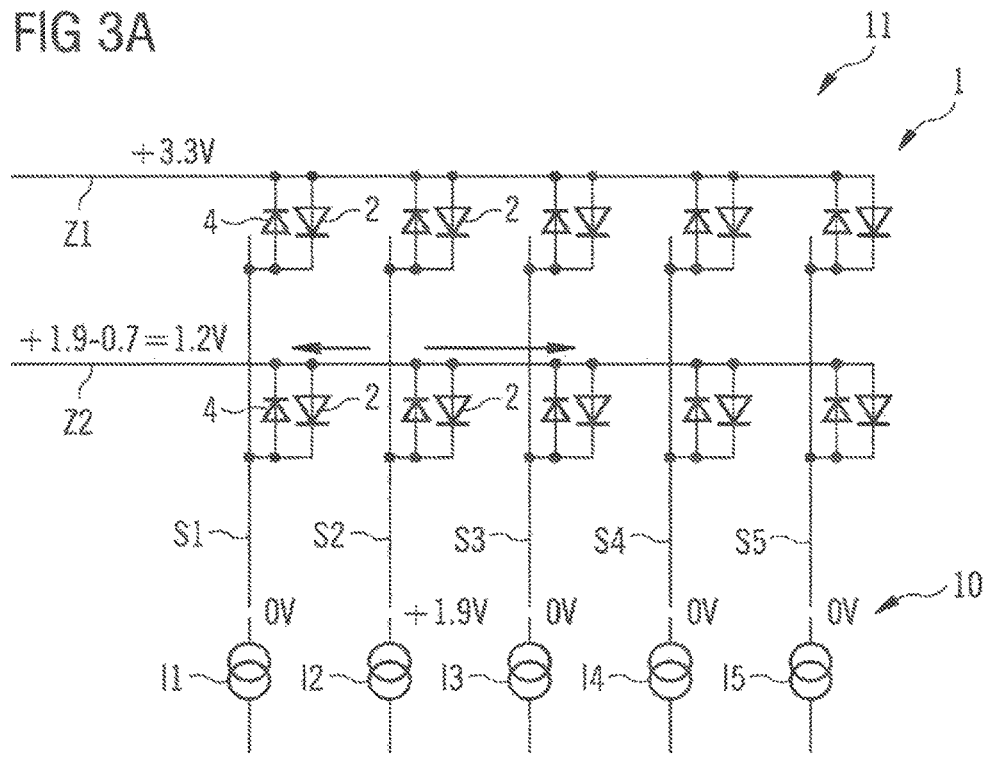

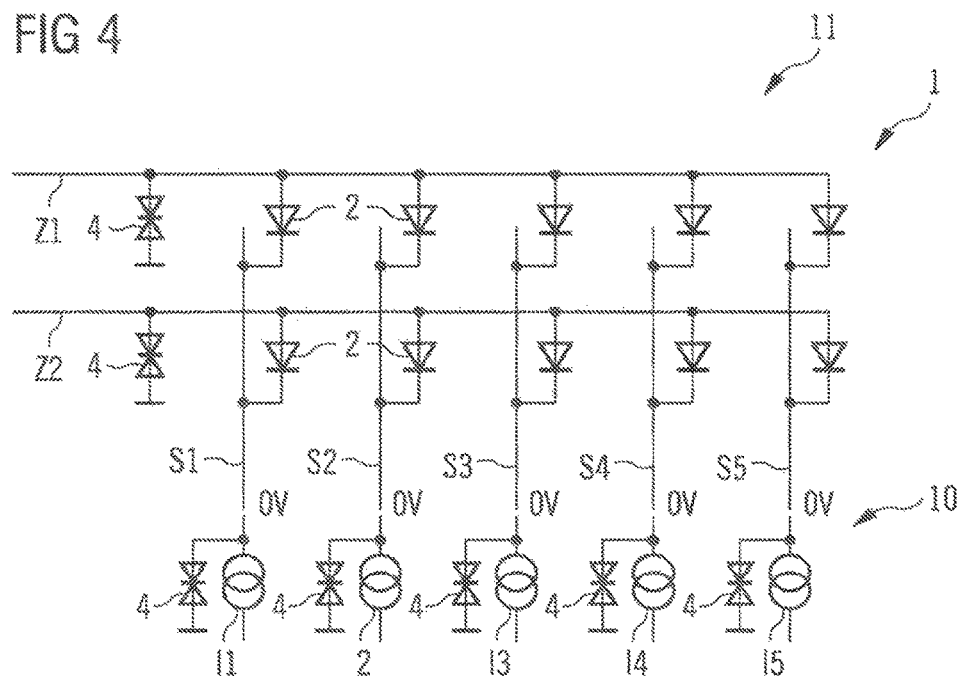

LIGHTING DEVICE, LIGHTING ARRANGEMENT COMPRISING LIGHTING DEVICE AND METHOD FOR OPERATING A LIGHTING DEVICE

CROSS-REFERENCES TO RELATED APPLICATIONS

This application is a continuation of U.S. application Ser. No. 15/387,553, filed Dec. 21, 2016, which is a continuation of U.S. application Ser. No. 14/410,565, filed Dec. 22, 2014, now U.S. Pat. No. 9,554,439, issued Jan. 24, 2017, which is a national stage application of International Patent Application No. PCT/EP2013/061907, filed Jun. 10, 2013, which claims the benefit of priority to German Patent Application No. 102012105630.7, filed on Jun. 27, 2012, all of which are hereby incorporated by reference in their entirety for all purposes.

DESCRIPTION

Lighting device, lighting arrangement comprising lighting device and method for operating a lighting device The present application relates to a lighting device, a lighting arrangement comprising a lighting device and a method for operating a lighting device.

In lighting devices, for example LED modules for use as headlights, use is often made of many LED chips which have to be driven individually or in groups during operation. For this purpose, two leads for external contact-connection can be provided for each LED. However, this necessitates a multiplicity of leads, as a result of which the distance necessary between the individual LEDs can increase.

One object is to specify a lighting device wherein individual components can be individually contact-connected in a compact and cost-effective configuration. Furthermore, the intention is to specify a method by which a lighting device can be driven efficiently.

In accordance with at least one embodiment of the lighting device, the latter comprises a plurality of components provided for generating radiation. The components can be provided for generating incoherent, partly coherent or coherent radiation. In particular, the components can be embodied as light emitting diodes (LEDs). The components can be embodied as unpackaged semiconductor chips or as components wherein the semiconductor chips are arranged in a package.

In accordance with at least one embodiment of the lighting device, the lighting device comprises a plurality of row lines and a plurality of column lines. The components are in each case electrically conductively connected to a row line and to a column line. Preferably, the components are arranged in matrix form, wherein the row lines are in each case assigned to a row of the matrix and the column lines are in each case assigned to a column of the matrix. However, a group of components can also be assigned to a crossover point of a row line with a column line. In this case, the components belonging to a group can respectively be driven only jointly. In this context, the term "crossover point" does not mean that the row lines and the column lines must overlap at the crossover point. Rather, the term crossover point defines which row line and which column line are assigned to the respective component or to the respective group of components.

The row lines and the column lines are preferably in each case electrically conductively connected to the same pole of the components. By way of example, the row lines can in each case be electrically conductively connected to the anode, and the column lines to the cathode, or vice versa. Preferably, the number of row lines is less than the number of column lines.

In accordance with at least one embodiment of the lighting device, the latter comprises between two and five row lines inclusive. In particular, the lighting device can comprise exactly two row lines.

In accordance with at least one embodiment of the lighting device, the lighting device comprises between two and eight column lines inclusive. In particular, the lighting device can comprise between four and six column lines inclusive.

In accordance with at least one embodiment of the lighting device, the latter is provided for the simultaneous operation of at least two components. In particular, at least two components which are assigned to mutually different column lines and mutually different row lines are operated simultaneously. Preferably, at least 10% of the components of the lighting device are operated simultaneously.

In accordance with at least one embodiment of the lighting device, an ESD (Electro Static Discharge) protection element is assigned to at least one component. An ESD protection element is provided in order that a voltage which is applied to a component on account of electrostatic charging and which could lead to damage to the component in the case of a discharge can flow away. Preferably, an ESD protection element is assigned to each component.

In one configuration, an ESD protection element is connected in parallel with each component. In this case, the number of ESD protection elements corresponds to the number of components.

In one alternative configuration, a common ESD protection element is in each case assigned to the components which are electrically conductively connected to a row line, and/or to the components which are electrically conductively connected to a column line. In other words, an ESD protection element is in each case provided for each row line and/or each column line, respectively.

The ESD protection element can be embodied as a unidirectionally blocking element, for example as an ESD diode. Alternatively, the ESD protection element can be embodied as bidirectionally blocking with a breakdown characteristic. By way of example, the ESD protection element can be embodied as a varistor, a thyristor or as a diode arrangement comprising two series-connected diodes having mutually opposite forward directions. An active ESD protection element, for example a so-called "gated diode", can also be used.

In accordance with at least one embodiment, the lighting device comprises a carrier, on which the row lines, the column lines and the components are arranged. The carrier can for example contain a ceramic or consist of a ceramic. A printed circuit board can also be used for the carrier. The ESD protection element or the ESD protection elements can be arranged on the carrier. Alternatively, the ESD protection element or the ESD protection elements can be arranged on a printed circuit board provided in addition to the carrier.

In accordance with at least one embodiment, the lighting device is designed for a headlight, in particular for a headlight of a motor vehicle. In particular, the lighting device can be designed for an adaptive front-lighting system (AFS). A lighting device comprising exactly two row lines is particularly suitable for an AFS.

In accordance with at least one embodiment, a lighting arrangement comprises such a lighting device and a drive circuit. By means of the drive circuit, an operating potential of the row lines is variable in each case between at least two states and the column lines are in each case electrically conductively connected to a current driver. The current can therefore be set for the column lines in each case independently of one another. It goes without saying that the terms "row line" and "column line" are interchangeable insofar as the current drivers can also be connected to the row lines and the operating potential of the column lines is variable in each case between at least two states.

In accordance with at least one embodiment of the lighting arrangement, the column lines are operable with three potential states. In addition to a state having a high potential ("high") and a state having a low potential ("low"), therefore, the column line is operable with an intermediate voltage lying between the aforementioned voltage values.

In accordance with at least one embodiment of the lighting arrangement, one state of the row lines is a high-impedance state. Such a state can be provided by a so-called tristate structure.

A lighting arrangement wherein the column lines are operable with three potential states and the row lines are operable in a high-impedance state is particularly suitable for a lighting device wherein in each case a unidirectionally blocking ESD protection element is connected in parallel with the individual components.

In a method for operating a lighting device in accordance with at least one embodiment, the lighting device comprises a plurality of components provided for generating radiation, a plurality of row lines and a plurality of column lines, wherein the components are in each case electrically conductively connected to a row line and to a column line.

In accordance with at least one embodiment of the method, in each case one of at least two states is set for an operating potential of the row lines.

In accordance with at least one embodiment of the method, a current supply of the column lines is set in each case by means of a current driver. The column lines are therefore energized independently of one another by means of the respectively assigned current driver. The individual current drivers can be embodied in each case as outputs of a common current source or as mutually separate current sources.

In accordance with at least one embodiment of the method, components provided for generating radiation are preselected by the setting of an activated state for the assigned row lines. That is to say that, at the respective point in time, all components which are assigned to a row line having a non-activated state emit no radiation. In this case, the designation "preselected" does not imply a temporal order of the setting of the states for the row lines and the column lines. From the components assigned to the activated row lines, those components whose assigned column line is activated emit radiation at the point in time mentioned. In the simplest case, a component is activated by the setting of a "high" state for the assigned row line in conjunction with a "low" state on the assigned column line, or vice versa. The absolute value of a voltage difference between the "high" state and the "low" state is expediently at least as high as the nominal operating voltage of the driven components.

In accordance with at least one embodiment of the method, a current intensity provided by the current driver is set depending on the number of row lines in the activated state. The higher the number of row lines in the activated state, the greater the number of components which are electrically connected in parallel with one another upon the energization of the column line assigned to the current driver. Given a number of n activated row lines, the current intensity is preferably n times the nominal current for an individual component.

In accordance with at least one embodiment of the method, the row lines are operated with a duty cycle of 100%. That is to say that the activated row lines are activated all together and components provided for generating radiation in each case can be energized all together. In each case only entire rows and/or entire columns are deactivated.

In accordance with at least one embodiment of the method, at least two row lines are operated alternately with a duty cycle of less than 100%, such that at least one component is deactivated and at least one further component in the column associated with the deactivated component and a further component in the row associated with the deactivated component are activated simultaneously. By means of the setting of the duty cycle, therefore, individual components can be deactivated without the need to deactivate the entire column assigned to the component or the entire row assigned. Preferably, the duty cycle is 100% divided by the number of row lines. In the case of two row lines, the duty cycle is accordingly 50%.

In order to compensate for the radiation energy emitted overall being lower on account of the reduced duty cycle, the current intensity can be increased, in particular in a manner corresponding to the inverse duty cycle. In the case of a duty cycle of 50%, the current intensity can be 200%, for example. The temporally averaged emitted radiation power of a component can thus correspond to the radiation power of the component during operation with a duty cycle of 100%.

In accordance with at least one embodiment of the method, in each case an ESD protection element having unidirectional blocking behavior with respect to the forward direction is connected in antiparallel with the components. One row line is operated in an activated state. A further row line is preferably operated in a high-impedance state. One column line is furthermore preferably operated in an activated state and a further column line is operated with an intermediate voltage, which is between the voltage of the activated state of the row line and the voltage of the activated state of the column line, such that the component connected to the activated row line and to the column line with the intermediate voltage is deactivated. In this way, electrical contact can be made even in a lighting device wherein an ESD protection element having unidirectional blocking behavior is in each case assigned to the components.

In the case of the lighting devices described above, given n rows and m columns, the number of connecting lines to be led towards the outside is n+m, while a total of 2*n*m lines would be necessary if the components were contact-connected individually.

The above-described lighting device and the lighting arrangement are particularly suitable for the method. Therefore, features described in connection with the lighting arrangement and the lighting device can also be used for the method, and vice versa.

Further features, configurations and expediencies will become apparent from the following description of the exemplary embodiments in association with the figures.

In the figures:

FIG. 1 shows one exemplary embodiment of a lighting device in schematic plan view;

FIGS. 2A to 2E show respectively a circuit for a lighting arrangement in accordance with a first exemplary embodiment and a second exemplary embodiment in FIGS. 2A and 2E, respectively, and different operating modes of the lighting arrangement in FIGS. 2B to 2D;

FIGS. 3A to 3D show a circuit for a lighting arrangement in accordance with a third exemplary embodiment in FIG. 3A and different operating modes of the lighting arrangement in FIGS. 3B to 3D; and FIG. 4 shows a circuit for a lighting arrangement in accordance with a fourth exemplary embodiment.

Elements that are identical, of identical type or act identically are provided with the same reference signs in the figures.

The figures and the size relationships of the elements illustrated in the figures among one another should not be regarded as to scale, rather individual elements may be illustrated with an exaggerated size in order to enable better illustration and/or in order to afford a better understanding.

One exemplary embodiment of a lighting device 1 is illustrated schematically in plan view in FIG. 1. The lighting device comprises a plurality of optoelectronic components 2 arranged in matrix form on a carrier 5. The carrier can be for example a ceramic carrier or a printed circuit board, in particular a metal-core printed circuit board.

A row line Z1, Z2 and a column line S1, S2, S3, S4 are respectively assigned to the rows and columns of the lighting device 1.

In this exemplary embodiment, the lighting device comprises two rows and four columns. It goes without saying, however, that the lighting device can also comprise more than two rows and correspondingly more row lines, for example between two and five row lines inclusive. Furthermore, the lighting device 1 can also comprise a number of columns deviating from four, for example between two and eight column lines inclusive.

For a headlight, for instance for a motor vehicle, an arrangement comprising exactly two row lines is particularly suitable for the lighting device. By means of the separate drivability of the two row lines, the function of a high beam as adaptive front headlight system and of a low beam can be realized in a simplified manner.

The row lines Z1, Z2 and the column lines S1 to S4 are embodied as continuous conductor tracks crossing one another. There is no direct electrical connection between the conductor tracks. By way of example, an insulation layer can be formed (not explicitly illustrated), between the conductor tracks for the row lines and the conductor tracks for the column lines.

The row lines and column lines need not necessarily cross one another. By way of example, it is also conceivable for only the row lines or only the column lines to be embodied in a continuous fashion and for individual segments of the non-continuous column lines or row lines to be connected to one another via connection lines such as bonding wires.

In each case exactly one component 2 is assigned to the crossover points of the row lines Z1, Z2 and column lines S1 to S4. In a departure from this, however, a group comprising a plurality of components can also be assigned to at least one crossover point. The components of a group can then be driven only jointly.

The components 2 are embodied as unpackaged LED semiconductor chips. The distance between the semiconductor chips of adjacent components can thus be minimized. A particularly compact configuration of the lighting device 1 is simplified thereby. The components are preferably embodied as LEDs. Superluminescence diodes can also be used. The use of coherent radiation sources, for example laser diodes, is also conceivable.

The semiconductor chips of the components 2 in each case have a rear-side contact relative to a main emission direction of the lighting device 1, said contact being electrically conductively connected to the row lines Z1, Z2, for example by means of a solder layer or an electrically conductive adhesive layer. An electrically conductive connection to the associated column lines S1 to S4 is effected via a connection line 3, for example a bonding wire, between a top-side contact of the semiconductor chip 2 and the associated column line. In the exemplary embodiment shown, the connection line extends through an opening 35 as far as the respective column line.

With regard to the arrangement of the contacts, however, other semiconductor chip geometries can also be used. By way of example, the semiconductor chip can be electrically connected via two front-side contacts by means of two connection lines. In this case, the rear side of the semiconductor chip can be electrically insulated from the row lines and the column lines. Semiconductor chips using so-called flip-chip geometry can also be used. A connection line can be dispensed with in this case.

Furthermore, the components 2 need not necessarily overlap the row lines Z1, Z2 in plan view. By way of example, the components can be arranged in a manner spaced apart laterally from the row lines and can be electrically conductively connected to the row lines via a connection line. It goes without saying that the components 2 can also be arranged on the column lines S1 to S4.

The semiconductor chips of the optoelectronic components 2 are preferably based on a III-V compound semiconductor material. III-V compound semiconductor materials are particularly suitable for generating radiation in the ultraviolet ($Al_xIn_yGa_{1-x-y}$ N) through the visible ($Al_xIn_yGa_{1-x-y}$ N, in particular for blue to green radiation, or $Al_xIn_yGa_{1-x-y}$ P, in particular for yellow to red radiation) to the infrared ($Al_xIn_yGa_{1-x-y}$ As) spectral range. It holds true here in each case that $0 \leq x \leq 1$, $0 \leq y \leq 1$ and $x+y \leq 1$, in particular where $x \neq 1$, $y \neq 1$, $x \neq 0$ and/or $y \neq 0$. With compound semiconductor materials, in particular from the material systems mentioned, high internal quantum efficiencies can furthermore be obtained when generating radiation.

Instead of unpackaged semiconductor chips, designs in which the semiconductor chips provided for generating radiation are arranged in a package can also be used for the components 2. Although such components require more space on the carrier, they can be distinguished by a higher mechanical robustness, for example.

A circuit for a lighting arrangement 11 comprising a lighting device 1 and a drive circuit 10 is illustrated in FIG. 2A. The lighting device can be embodied in particular as described in connection with FIG. 1. In this exemplary embodiment, ten components are arranged in matrix form and are electrically conductively connected to two row lines Z1, Z2 and five column lines S1 to S5. The row lines are in each case electrically conductively connected to the anodes of the components 2, and the column lines to the cathodes of the components 2. The lighting device 1 therefore has a total of seven connections to the drive circuit 10.

In each case a separate current driver I1 to I5 is assigned to the column lines S1 to S5. In order to reduce the averaged radiation power, a pulse width modulation with which the components 2 can be dimmed can be used in all of the exemplary embodiments.

Different operating modes of the lighting arrangement during operation are illustrated in the tables in FIGS. 2B to 2D. In each case the states of the row lines Z1, Z2 and of the column lines S1 to S5 and the illumination pattern resulting therefrom are shown here. An "x" in the tables means in each case a component in the radiation-emitting state.

In the case of the configuration illustrated in FIG. 2B, the row line Z1 is in a high (H) state and the row line Z2 is in a low (L) state. In this configuration, all of the components assigned to the row line Z2 are deactivated. From the components assigned to the row line Z1, those which are in a low state emit radiation, that is to say the components assigned to the column lines S1 and S3 to S5. As shown by way of example on the basis of the column line S2, by assigning a high state for one column line, it is therefore possible to deactivate an individual component of an activated row line, here the row line Z1. It goes without saying that other components or more than one component of the components assigned to the row line Z1 can also be deactivated by suitable setting of the states.

In contrast thereto, in the case of the configuration illustrated in FIG. 2C, both row lines Z1 and Z2 are in the high state. Consequently, all components apart from those which are assigned to the column line S2 emit radiation. For the implementation of the states illustrated in FIGS. 2B and 2C, the individual row lines Z1 and Z2 and thus all the components 2 of the lighting device 1 can be operated with a duty cycle of 100%. All activated components thus emit radiation simultaneously.

In the configuration illustrated in FIG. 2C, in each case two components 2 electrically connected in parallel with one another are assigned to the current drivers I1 to I5 respectively assigned to the column lines S1 to S5. For an energization of the components, the current drivers I1 to I5 preferably supply in each case nominally double the operating current relative to the nominal operating current for one component 2. In the case of more than two row lines, the operating current provided by the current driver is multiplied in a manner corresponding to the number n of activated row lines.

FIG. 2D shows an operating mode in which, in contrast to the operating modes shown in FIGS. 2B and 2C, an individual component 2 is deactivated without the entire associated row or the entire associated column having to be deactivated. For this purpose, the row lines Z1 and Z2 are alternately activated in each case with a duty cycle of 50%. A low state is in each case assigned to the column lines S1 and S3 to S5, such that the components assigned to said column lines in each case emit radiation with a duty cycle of 50%. By contrast, at the times in which the row line Z1 is activated, the column line S2 is put into the high state, such that the component assigned to the row line Z1 and the column line S2 does not emit radiation. At the times at which the row line Z2 is activated, the column line S2 is put into the low state, such that the component assigned to the row line Z2 and the column line S2 emits radiation. The reduction of the emitted light energy on account of the reduced duty cycle compared with the state illustrated in FIG. 2B can be compensated for by a doubling of the operating current, such that the individual activated components 2, in the operating mode illustrated in FIG. 2D as well, emit with the same or at least substantially the same radiation power averaged temporally. Although the lighting device has only 2+5=7 connections to the drive circuit 10 instead of 2×10=20 connections in the case where the components are contact-connected individually, the components 2 can all be activated and deactivated individually and independently of one another, without the averaged output power being reduced as a result. Such a lighting device and such a method for operating a lighting device are therefore particularly suitable for use in a headlight, in particular an adaptive headlight system.

Instead of the configuration of the lighting arrangement illustrated in FIG. 2A, a lighting arrangement in accordance with a second exemplary embodiment is also suitable, the circuit of which is illustrated in FIG. 2A. In contrast to the exemplary embodiment illustrated in FIG. 2A, an ESD protection element 4 is in each case assigned to the components 2, wherein the ESD protection element is embodied as blocking in both directions with a breakdown characteristic. By way of example, the ESD protection element can be a thyristor, a varistor or a diode circuit comprising two series-connected diodes having mutually opposite forward directions. An active ESD protection element such as a gated diode can also be used.

By means of the ESD protection elements 4, each individual component 2 can be protected against damage on account of an electrostatic discharge. Such a lighting arrangement is distinguished by a particularly high robustness and a reduced failure risk associated therewith. The ESD protection elements 4 can be arranged on the same carrier 5 as the optoelectronic components 2. Furthermore, the ESD protection element can also be integrated into the component 2, in particular into the semiconductor chip. Alternatively, however, the ESD protection elements 4 can also be arranged on a printed circuit board provided in addition to the carrier 5.

Using bidirectionally blocking ESD protection elements an ESD protection for the components may be integrated, without the drive circuit 10 having to be modified for this purpose.

In contrast thereto, FIG. 3A shows a circuit for a third exemplary embodiment of a lighting arrangement, wherein the ESD protection elements 4 are embodied in each case as unidirectionally blocking components, in particular as ESD diodes. The forward direction of the ESD protection diodes is oriented antiparallel to the forward direction of the associated component 2.

Different operating modes of the lighting device are illustrated on the basis of the tables in FIGS. 3B to 3D, wherein the pattern of the activated components 2 corresponds to the tables in accordance with FIGS. 2B to 2D.

In contrast to the description of FIGS. 2A to 2E, the states of the row lines Z1, Z2 are switchable between a high state and a high-impedance state (Z state). Such a state can be provided by what is called a tristate circuit, for example. The states of the row lines and column lines entered in FIG. 3B correspond to the illustration shown in FIG. 3A, a value of +3.3 V representing the high state and a voltage of 0 V representing the low state. A medium voltage M of +1.9 V is assigned to the column line S2. This voltage therefore lies between the high state and the low state. The intermediate voltage M is chosen such that the component 2 assigned to the row line Z1 and the column line S2 does not emit radiation at the resulting difference voltage (in the exemplary embodiment 3.3 V−1.9 V=1.4 V). This component can be deactivated as a result.

A potential of 1.9 V−0.7 V=1.2 V is established on the row line Z2 to which the high-impedance state Z is assigned, since the protection diode 4 connected in antiparallel with the component 2 assigned to the row Z2 and the column S2, for the intermediate voltage M present, is oriented in the forward direction. However, this resulting voltage of 1.2 V does not bring about radiation emission of the components 2 assigned to the row line Z2.

A deactivation of an entire column can be achieved, as illustrated by way of example for the column S2 in FIG. 3C, by the intermediate voltage M being assigned to said column line.

A deactivation of an individual component 2 can be achieved, as illustrated in FIG. 3D, by an activation of the row lines Z1, Z2 with a correspondingly reduced duty cycle (that is to say 50% for two row lines), if the M state is assigned for the column line associated with the component to be deactivated during the activation of the assigned row line. With the described method of driving, therefore, even for a lighting device wherein an ESD protection element having unidirectional blocking behavior is assigned to each optoelectronic component 2, each component 2 can be driven individually. Although such operation requires driving of the row lines with a high-impedance state and a suitable intermediate voltage for the column lines, whereby the complexity of the drive circuit 10 is increased, driving embodied in such a way can nevertheless be expedient since it is more tolerant to leakage currents possibly occurring, for example in the LEDs.

The circuit of the fifth exemplary embodiment of a lighting arrangement as illustrated in FIG. 4 substantially corresponds to the exemplary embodiment described in connection with FIG. 2E. In contrast thereto, an ESD protection element is not individually assigned to each component 2, rather each row line Z1, Z2 and each column line S1 to S5 are in each case provided with an ESD protection element 4.

Compared with a configuration in which an ESD protection element is individually assigned to each component 2, the number of protection elements required can be reduced. In this exemplary embodiment, by way of example, a zener diode or a diode arrangement comprising two series-connected diodes oriented oppositely with regard to their forward direction, a thyristor or a varistor is suitable for the ESD protection element.

This patent application claims the priority of German patent application 10 2012 105 630.7, the disclosure content of which is hereby incorporated by reference.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

We claim:

1. A lighting arrangement comprising:
   a lighting device comprising:
      a plurality of components provided for generating radiation; and
      a plurality of row lines and a plurality of column lines, wherein the components are in each case electrically conductively connected to a row line and to a column line; and
   a drive circuit,
   wherein the lighting arrangement is configured to provide simultaneous operation of at least two components,
   wherein an operating potential of the row lines is variable in each case between at least two states,
   wherein the column lines are in each case connected to a current driver, and wherein a current intensity of the current driver is set based on a number of row lines that are in an activated state.

2. The lighting arrangement according to claim 1, wherein the lighting arrangement is configured to preselect components provided for generating radiation by setting of an activated state for assigned row lines and to operate them by activation of the current driver of an assigned column line.

3. The lighting arrangement according to claim 1, wherein the lighting arrangement is configured to operate row lines with a duty cycle of 100% wherein in each case only entire rows and/or entire columns are deactivated.

4. The lighting arrangement according to claim 1, wherein the lighting arrangement is configured to operate at least one component in an associated column and an associated row in such a way that the at least one component is deactivated and neither an entire associated column nor an entire associated row are deactivated at a same time.

5. The lighting arrangement according to claim 4, wherein the lighting arrangement is configured to operate at least two row lines alternately with a duty cycle of less than 100%.

6. The lighting arrangement according to claim 1, wherein the lighting arrangement is configured to operate least two row lines alternately with a duty cycle of less than 100% and to increase a current intensity in a manner corresponding to an inverse of the duty cycle.

7. The lighting arrangement according to claim 1, wherein an ESD protection element is assigned to at least one component.

8. The lighting arrangement according to claim 7, wherein the ESD protection element has a unidirectional blocking behaviour.

9. The lighting arrangement according to claim 1, wherein a common ESD protection element is in each case assigned to the components which are electrically conductively connected to a row line, and/or to the components which are electrically conductively connected to a column line.

10. The lighting arrangement according to claim 1, wherein an ESD protection element is connected in parallel with each component.

11. The lighting arrangement according to claim 1, wherein the lighting device comprises between two and eight row lines inclusive and between two and eight column lines inclusive.

12. The lighting arrangement according to claim 1, wherein the lighting device comprises exactly two row lines.

13. The lighting arrangement according to claim 1, wherein the lighting device is designed for a headlight.

14. The lighting arrangement according to claim 1, wherein the lighting arrangement is configured to operate the column lines with three potential states, one of said potential states of the row lines being a high-impedance state.

15. A lighting arrangement comprising:
   a lighting device comprising:
      a plurality of components provided for generating radiation;
      exactly two row lines; and
      a plurality of column lines, and
   a drive circuit,
   wherein the lighting device is designed for a headlight,
   wherein the components are in each case electrically conductively connected to a row line and to a column line,
   wherein the lighting arrangement is provided for a simultaneous operation of at least two components, and wherein the lighting arrangement is configured to operate at least two row lines alternatively with a duty cycle of less than 100% and to increase a current intensity in a manner corresponding to an inverse of the duty cycle.

16. A lighting arrangement comprising:

a lighting device comprising:

a plurality of components provided for generating radiation; and a plurality of row lines and a plurality of column lines, wherein the components are in each case electrically conductively connected to a row line and to a column line;

and a drive circuit, wherein the lighting arrangement is configured to provide simultaneous operation of at least two components, the lighting arrangement is configured to operate at least one component in an associated column and an associated row in such a way that the at least one component is deactivated and neither an entire associated column nor an entire associated row are deactivated at a same time.

\* \* \* \* \*